US006365495B2

(12) United States Patent
Wang et al.

(10) Patent No.: US 6,365,495 B2
(45) Date of Patent: *Apr. 2, 2002

(54) METHOD FOR PERFORMING METALLO-ORGANIC CHEMICAL VAPOR DEPOSITION OF TITANIUM NITRIDE AT REDUCED TEMPERATURE

(75) Inventors: Shulin Wang, Campbell; Huan Luo, San Jose; Keith K. Koai, Los Gatos; Ming Xi, Milipitas; Mei Chang, Saratoga; Russell C. Ellwanger, San Juan Bautista, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,183

(22) Filed: Feb. 9, 1999

Related U.S. Application Data

(63) Continuation-in-part of application No. 09/008,796, filed on Jan. 20, 1998, which is a continuation-in-part of application No. 08/810,221, filed on Feb. 28, 1997, and a continuation-in-part of application No. 08/567,461, filed on Dec. 5, 1995, which is a continuation-in-part of application No. 08/498,990, filed on Jul. 6, 1995, now abandoned, and a continuation-in-part of application No. 08/339,521, filed on Nov. 14, 1994, now abandoned.

(51) Int. Cl.[7] .............................................. H01L 21/28
(52) U.S. Cl. ....................... 438/582; 438/584; 427/570; 427/573; 427/590
(58) Field of Search ................................. 427/570, 590, 427/573, 535, 255.38; 438/582, 584

(56) References Cited

U.S. PATENT DOCUMENTS

| 4,173,661 A | 11/1979 | Bourdon ...................... 427/39 |
| 5,175,126 A | 12/1992 | Ho et al. ..................... 437/190 |

(List continued on next page.)

FOREIGN PATENT DOCUMENTS

| EP | 0 467 623 B1 | 1/1992 | |
| EP | 0 477 990 A2 | 4/1992 | |
| EP | 0 545 602 A1 | 6/1993 | ......... H01L/21/285 |
| EP | 0 678 903 A1 | 10/1995 | |
| EP | 0 711 846 A1 | 5/1996 | |

(List continued on next page.)

OTHER PUBLICATIONS

Park et al "A Novel A1–Reflow Process Using Surface Modification by the ECR Plasma Treatment and its Application to the 256Mbit DRAM", Semiconductor R & D Center, Samsung Electronics Co. Ltd., pp. 5.4.1–5.4.4, 1994.

*Primary Examiner*—David Nelms
*Assistant Examiner*—Reneé R. Berry
(74) *Attorney, Agent, or Firm*—Moser, Patterson & Sheridan, LLP

(57) ABSTRACT

A process for chemical vapor deposition of titanium nitride film using thermal decomposition of a metal-organic compound is disclosed. In particular, the deposition of titanium nitride film from tetrakis dimethylamino-titanium (TDMAT) is performed at a temperature preferably below 350° C. in the presence of helium and nitrogen. The process is performed at a total pressure of about 5 torr, a nitrogen dilutant gas flow of at least 500 sccm, preferably about 1000 sccm, and an edge purge gas flow of at least 500 sccm. These process parameters, coupled with an improved thermal conduction between the wafer and the heated pedestal, lead to a conformal deposition of titanium nitride film at a rate of at least 6 Å/sec.

23 Claims, 4 Drawing Sheets

U.S. PATENT DOCUMENTS

| | | | |
|---|---|---|---|
| 5,192,589 A | 3/1993 | Sandhu | 427/255.1 |
| 5,246,881 A | 9/1993 | Sandhu et al. | 437/192 |
| 5,254,499 A | 10/1993 | Sandhu et al. | 437/192 |
| 5,399,379 A | 3/1995 | Sandhu | 427/255.2 |
| 5,447,570 A | 9/1995 | Schmitz et al. | 118/728 |
| 5,480,684 A | 1/1996 | Sandhu | 427/531 |
| 5,516,367 A | 5/1996 | Lei et al. | 118/725 |
| 5,556,476 A | 9/1996 | Lei et al. | 118/728 |
| 5,571,572 A | 11/1996 | Sandhu | 427/585 |
| 5,576,071 A | 11/1996 | Sandhu | 427/534 |
| 5,661,115 A | 8/1997 | Sandhu | 427/534 |
| 5,766,365 A | 6/1998 | Umotoy et al. | 118/728 |
| 5,851,299 A | 12/1998 | Cheng et al. | 118/729 |
| 6,129,044 A * | 10/1999 | Zhao et al. | 118/715 |
| 6,071,572 A * | 6/2000 | Mosely et al. | 427/570 |
| 6,159,299 A | 12/2000 | Koai et al. | 118/715 |

FOREIGN PATENT DOCUMENTS

| | | | |
|---|---|---|---|
| EP | 0 720 214 A2 | 7/1996 | H01L/21/321 |
| EP | 0 738 002 A2 | 10/1996 | H01L/21/283 |
| EP | 0 776 991 A1 | 6/1997 | |
| GB | 2 299 345 A | 10/1996 | |
| JP | 63-229814 | 3/1987 | |

* cited by examiner

MOCVD TiN Purge Heater Recipes for 1x50 at 380°C

| Step / Name | 1 Pump down | 2 Chuck | 3 Heatup | 4 Pre-Dep | 5 Deposition 1 | 6 Pre-plsm | 7 Plasma | 8 Purge |
|---|---|---|---|---|---|---|---|---|
| Time (sec) | 5.0 | 5.0 | 20 | 12 | 18 | 3.0 | 35 | 2.0 |
| Chamber Pressure (Torr) | TVFO | TV to 210 | 6.5 | 5.0 | 5.0 | TV to 300 | 1.3 | TVFO |
| Heater Temp (°C) | 380 | 380 | 380 | 380 | 380 | 380 | 380 | 380 |
| RF Power (W) | 0 | 0 | 0 | 0 | 0 | 0 | 750 | 0 |
| Backside Pressure (Torr) | 0 | 0 | 4.5 | 3.5 | 3.5 | 0 | 0 | 0 |
| N2Dil: (sccm) | | 1000 | 1000 | 1000 | 1000 | 300 | 300 | 1000 |
| HeDil: (sccm) | | 600 | 600 | 325 | 325 | | | |
| HeCarrier: (sccm) | | | | 275 btc | 275 | 200 | | |
| EPN2: (sccm) | | | 1500 | 1500 | 1500 | | | |
| BPN2: (sccm) | | | 1000 | 1000 | 1000 | | | |
| H2: (sccm) | | | | | | 450 | 450 | |

FIG. 3

Notation Definition: TV=Throttle Valve, TVFO=TV Fully Open, btc=bypass to chamber, Dil=dilution, EPN2=edge purge N2, BPN2=bottom purge N2.

METHOD FOR PERFORMING METALLO-ORGANIC CHEMICAL VAPOR DEPOSITION OF TITANIUM NITRIDE AT REDUCED TEMPERATURE

CROSS REFERENCE TO RELATED APPLICATIONS

This application is a continuation-in-part of co-pending U.S. patent application Ser. No. 09/008,796, entitled "Plasma Annealing of Substrates to Improve Adhesion", filed on Jan. 20, 1998, which is a continuation-in-part of U.S. patent application Ser. No. 08/810,221, entitled "Construction of a Film on a Semiconductor Wafer", filed on Feb. 28, 1997, which is a continuation-in-part of U.S. patent application Ser. No. 08/498,990, entitled "Biased Plasma Annealing of Thin Films", filed on Jul. 6, 1995, now abandoned, and of U.S. patent application Ser. No. 08/339,521, entitled "Improved Titanium Nitride Layers Deposited by Chemical Vapor Deposition and Method of Making", filed on Nov. 14, 1994, now abandoned, and of U.S. patent application Ser. No. 08/567,461, entitled "Plasma Annealing of Thin Films" filed on Dec. 5, 1995. This application also contains subject matter that is related to U.S. patent application entitled "Wafer Pedestal With A Purge Ring", U.S. Pat. No. 6,159,299, filed simultaneously herewith Each of the aforementioned related patent applications is herein incorporated by reference.

BACKGROUND OF THE DISCLOSURE

1. Field of the Invention

The invention relates to a method of film deposition and, more particularly, to a titanium nitride film deposition process using a metallo-organic precursor.

2. Description of the Background Art

Titanium nitride (TiN) film is widely used as a barrier or contact layer in integrated circuit fabrication, particularly for device applications. A TiN film may be formed by metallo organic chemical vapor deposition (MOCVD) using precursors such as tetrakis (dialkylamino)-titanium, or $Ti(NR_2)_4$, where R is an alkyl group. For example, U.S. Pat. No. 5,246,881, issued on Sep. 21, 1993, discloses thermal decomposition of tetrakis (dimethylamino)-titanium, or TDMAT, in combination with an activated species, for TiN deposition at temperatures of 200–600° C. and pressures of about 0.1 to 100 torr. Another U.S. Pat. No. 5,576,071 ('071 patent), issued on Nov. 19, 1996, discloses a similar TiN deposition process in the presence of a reactive carrier gas such as nitrogen at a pressure of 0.1–10 torr and a temperature in the range of 200–700° C.

While the choice of deposition parameters is primarily dictated by the desired electrical and physical characteristic of the deposited film, it is also constrained by the need for compatibility with other materials already present on the wafer substrate. For example, for sub-0.25 $\mu$m device applications, the capacitance of metal interconnects can contribute significantly to signal delays. To satisfy both circuit speed and cross-talk requirements between metal interconnects, it is preferable that insulators be made of materials having a low dielectric constant (i.e., low $\kappa$ dielectric materials having $\kappa$ less than 3.8). However, current low $\kappa$ dielectric materials, which include a wide variety of fluorinated organic or inorganic compounds, are stable only up to about 400° C. Thus, backend processes including TiN deposition should preferably be performed at relatively low temperatures to ensure compatibility with these low $\kappa$ dielectrics and avoid adverse effects in device characteristics. However, deposition of TiN using a metallo-organic precursor at temperatures compatible with low $\kappa$ dielectric materials has a slow deposition rate.

Therefore, a need exists in the art for a relatively low temperature TiN deposition process which is compatible with low $\kappa$ dielectrics materials, without sacrificing the deposition rate necessary for a viable device manufacturing process.

SUMMARY OF THE INVENTION

The disadvantages associated with the prior art are overcome by a method of depositing a titanium nitride (TiN) film by supplying to a chamber containing a substrate a metallo-organic compound, a dilutant gas, and a purge gas having a flow rate of at least 500 sccm to produce a pressure within the chamber of at least about 5 torr, and heating the substrate to cause thermal decomposition of said metallo-organic compound to form a TiN film upon the substrate.

More specifically, precursor molecules such as tetrakis dialkylamino-titanium (TDMAT) are used in this thermal decomposition process such that TDMAT is decomposed at a sufficiently low temperature to ensure process compatibility with dielectric materials having relatively low dielectric constants (e.g., $\kappa$ less than 3.8) and without substantial reduction in deposition rate obtained by high temperature TiN deposition processes.

In the present invention, the wafer is maintained at a relatively constant processing temperature which is low enough to maintain stability for most of the low $\kappa$ materials used for sub-0.25 $\mu$m device fabrication. TDMAT, along with carrier and dilutant gases such as helium and nitrogen, are introduced into a process chamber where thermal decomposition of TDMAT occurs in close proximity to the heated wafer surface. The wafer is preferably kept at a temperature below 350° C. through thermal contact with a heated support pedestal. During film deposition, a total pressure in the deposition chamber is maintained at approximately 5 torr, with a nitrogen flow rate of about 1000 sccm, helium flow rate of about 600 sccm, and a wafer backside gas pressure of about 3.5 torr.

In accordance with one aspect of the present invention, a dual-purge gas flow of nitrogen at a rate greater than 1000 sccm is used to minimize undesirable deposit on the edge of the heated pedestal, as well as on the surfaces of an edge ring assembly that circumscribes the pedestal. Furthermore, this purge flow contributes to improving the deposition rate and step coverage of the deposited film.

The present invention allows titanium nitride (TiN) film to be deposited at a relatively high rate of greater than 6 Å/sec., along with improved uniformity, step coverage, and thermal conduction between the wafer and the heated pedestal.

The as-deposited TiN film is subsequently subject to a plasma treatment or annealing step in the presence of hydrogen and nitrogen. The treated TiN film, having a much reduced resistivity compared to the pre-treated film, is suitable for use as a diffusion or contact barrier.

The reduced temperature TiN deposition process of the present invention is fully compatible with the low temperature requirement imposed by the presence of low $\kappa$ dielectric materials. Moreover, the dual-purge capability of the present invention provides a deposit-free, and thus maintenance-free, pedestal heater, and mitigates the problems of micro-arcing and particulate contamination of process wafers.

BRIEF DESCRIPTION OF THE DRAWINGS

The teachings of the present invention can be readily understood by considering the following detailed description in conjunction with the accompanying drawings, in which:

FIG. 2b shows an expanded cross-sectional view of the pedestal, purge ring and the edge ring assembly of the process chamber of FIG. 2a; and FIG. 3 shows a process recipe for depositing a titanium nitride film in accordance with the present invention.

To facilitate understanding, identical reference numerals have been used, where possible, to designate identical elements that are common to the figures.

DETAILED DESCRIPTION

The present invention is a method of depositing conformal titanium nitride (TiN) film using a tetrakis (dialkylamino)-titanium (TDMAT) precursor at a temperature below about 350° C. As such, the process of the present invention is compatible with dielectric materials having dielectric constants below 3.8 (low κ materials) used in sub-0.25 μm applications.

System 10

Figure 1:
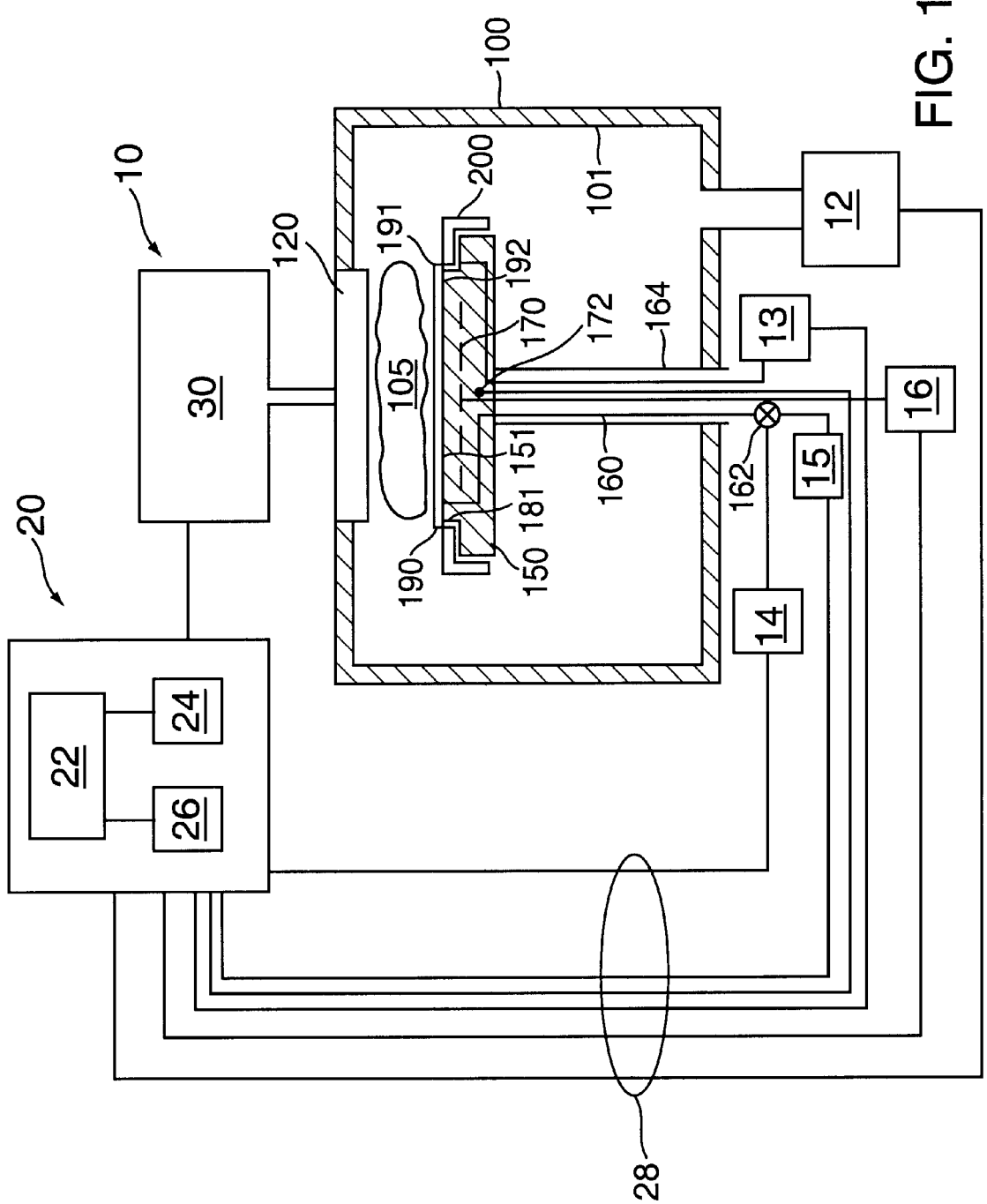
FIG. 1 shows a schematic illustration of an apparatus used for MOCVD of TiN film in accordance with the present invention.

FIG. 1 is a schematic representation of a wafer processing system 10 that can be used to perform TiN film deposition in accordance with the present invention. This apparatus typically comprises a process chamber 100, a gas panel 30, a control unit 20, along with other hardware components such as power supplies and vacuum pumps. Details of the system 10 used in the present invention are described in a commonly-assigned U.S. patent application, entitled "Reactor Useful for Chemical Vapor Deposition of Titanium Nitride", Ser. No. 09/023,852, filed Feb. 13, 1998, and is herein incorporated by reference. The salient features of this system 10 are briefly described below.

Chamber 100

The process chamber 100 generally comprises a support pedestal 150, which is used to support a substrate such as a semiconductor wafer 190. This pedestal 150 can typically be moved in a vertical direction inside the chamber 100 using a displacement mechanism (not shown). Depending on the specific process, the wafer 190 has to be heated to some desired temperature prior to processing. In the present invention, the wafer support pedestal 150 is heated by an embedded heater element 170. For example, the pedestal 150 may be resistively heated by applying an electric current from an AC supply 16 to the heater element 170. The wafer 190 ts, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supply 16 for the heating element 170 such that the wafer temperature can be maintained or controlled at a desired temperature which is suitable for the particular process application.

A vacuum pump 12, is used to evacuate the process chamber 100 and to maintain the proper gas flows and pressure inside the chamber 100. A showerhead 120, through which process gases are introduced into the chamber 100, is located above the wafer support pedestal 150. This showerhead 120 is connected to a gas panel 30 which controls and supplies various gases used in different steps of the process sequence.

In the present embodiment, TiN film deposition is accomplished by thermal decomposition of a metallo-organic compound such as TDMAT. TDMAT is introduced into the process chamber 100 by bubbling a carrier gas, such as helium, through a liquid sample contained in an ampoule or bubbler (not shown). Alternatively, a direct liquid injection system may also be used to introduce TDMAT into the chamber 100.

To facilitate sample delivery using a bubbler, the bubbler is maintained at a temperature of about 50° C. to provide a TDMAT vapor pressure of greater than about 0.6 torr. Proper control and regulation of the gas flows through the gas panel 30 is performed by mass flow controllers (not shown) and a controller unit 20 such as a computer. The showerhead 120 allows process gases from the gas panel 30 to be uniformly distributed and introduced into the chamber 100. Illustratively, the control unit 20 comprises a central processing unit (CPU) 22, support circuitry 24, and memories containing associated control software 26. This control unit 20 is responsible for automated control of the numerous steps required for wafer processing—such as wafer transport, gas flow control, temperature control, chamber evacuation, and so on. Bi-directional communications between the control unit 20 and the various components of the apparatus 10 are handled through numerous signal cables collectively referred to as signal buses 28, some of which are illustrated in FIG. 1.

A substrate, such as a wafer 190, which is positioned below and in close proximity to the showerhead 120, is retained on the pedestal 150 by vacuum chucking. The back surface, or backside 192, of the wafer 190 is coupled to a vacuum line 160. This vacuum line 160 evacuates the wafer backside 192 such that a pressure difference is established between the front surface 191 and the back surface 192 of the wafer 190. This net front pressure serves to hold the wafer 190 in position atop the pedestal 150. A three-way valve 162 is provided in the vacuum line 160 to connect between the wafer backside 192, a vacuum pump 14, and a gas supply 15. Depending on the specific application, this valve 162 can be controlled to optionally introduce a backside gas to the wafer backside 192 as needed. The control unit 20 maintains the proper backside gas flow and pressure by controlling the valve 162, vacuum pump 14 and backside gas supply 15. Of course, other methods of retaining the wafer 190 may be used—e.g., electrostatic chuck, mechanical clamping, or simple gravity. In this particular embodiment, vacuum chucking and the use of a backside gas help improve the thermal conduction between the heated pedestal 150 and the wafer 190. As a result, the wafer 190 can be maintained at a relatively constant temperature by the heated pedestal 150 during the film deposition process. A detailed discussion of the use of backside gas in conjunction with a vacuum chuck is presented below.

The heated pedestal 150 used in the present invention is made of aluminum, and comprises a heating element 170 embedded at a distance below the wafer support surface 151 of the pedestal 150. The heating element 170 is made of a nickel-chromium wire encapsulated in an Incoloy sheath tube. By properly adjusting the current supply 16 to the heating element 170, the wafer 190 and the pedestal 150 can be maintained at a relatively constant temperature during film deposition. This is accomplished by a feedback control loop, in which the temperature of the pedestal 150 is continuously monitored by a thermocouple 172 embedded in the pedestal 150. This information is transmitted to the control unit 20 via a signal bus 28, which responds by sending the necessary signals to the heater power supply 16. Adjustment is subsequently made in the current supply 16 so as to maintain and control the pedestal 150 at a desirable temperature—i.e., a temperature which is appropriate for the specific process application. When the process gas mixture exits the showerhead 120, thermal decomposition of TDMAT occurs at the surface 191 of the heated wafer 190, a eresulting in a deposition of TiN film upon the wafer 190.

Gas Purge and Edge Ring Assembly

In the conventional MOCVD TiN process, chamber cleaning is typically performed by a wet clean process after extended wafer processing. Not only does a wet clean process lead to significant equipment downtime; but in between equipment cleaning, micro-arcing and particulate contamination may arise due to the accumulation of TiN film on the wall or vertical edge 181 of the pedestal 150. In the present invention, these problems are mitigated by implementing a continuous purge gas flow adjacent to the pedestal edge 181 during TiN deposition.

Figure 2A:
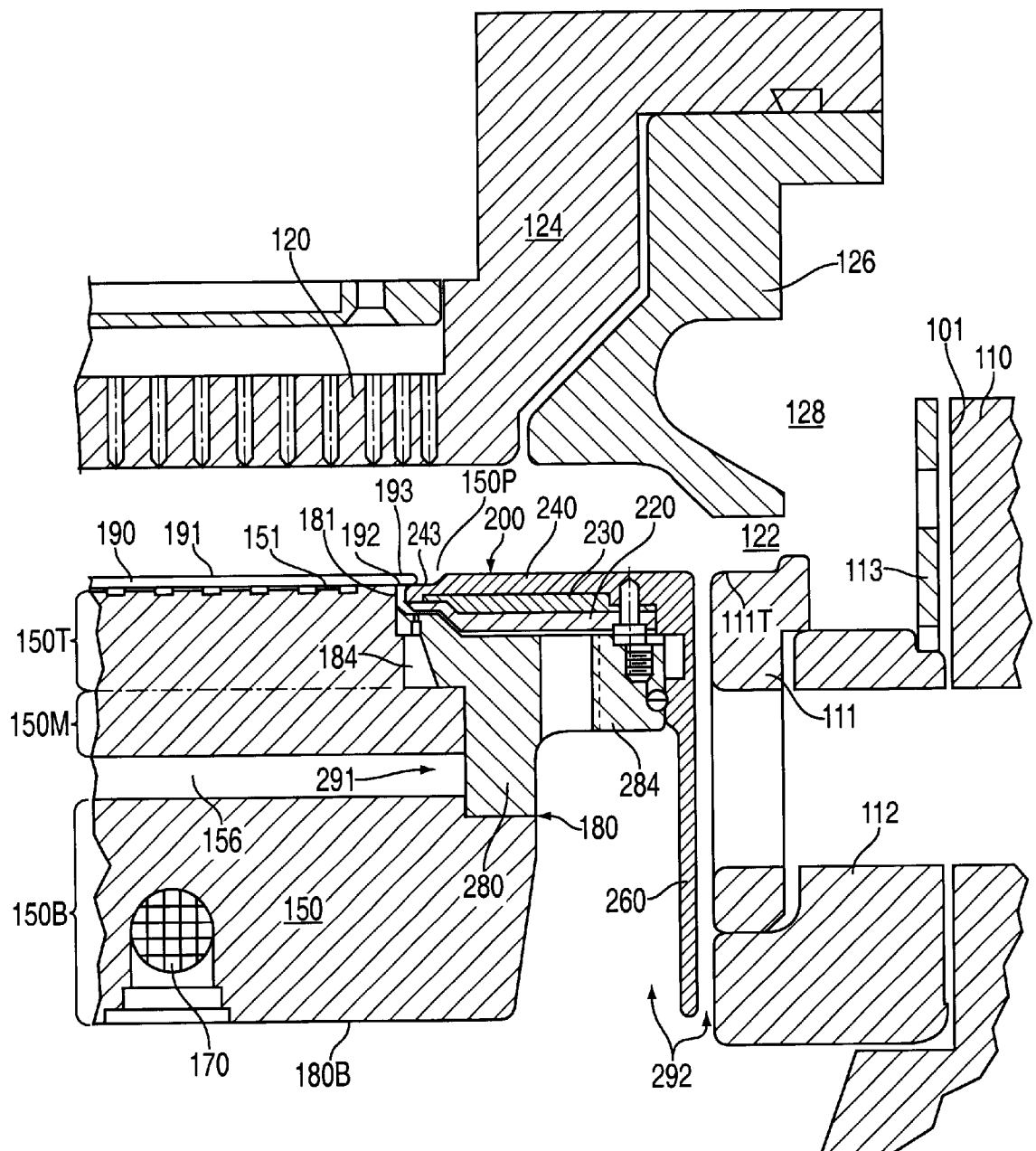
FIG. 2a shows a partial cross-sectional view inside the process chamber used for practicing the present invention.

FIG. 2a illustrates a partial cross-sectional view of the interior of the process chamber 100, which is used for practicing the present invention. The pedestal 150 is enclosed inside the chamber body 110 and is located below a showerhead 120, which supplies process gases and distributes them uniformly over the vicinity of a wafer 190. A lid isolator 126 is disposed around the outside 124 of the showerhead 120 to isolate the showerhead 120, which can be RF driven, from the grounded chamber body 110 and lid plate (not shown). RF power is coupled to the showerhead 120 for plasma annealing of deposited films.

An edge ring assembly 200 rests upon a purge ring 280, which is disposed circumferentially around the pedestal 150. Various chamber components are disposed between the edge ring assembly 200 and the chamber body 110, including: 1) an inner shield 111 which is used to confine the plasma from entering a pumping channel 128; 2) a chamber insert 112 for electrically isolating the inner shield 111 from the chamber body 110; and 3) an outer shield 113 to avoid undesirable deposition on the inner wall 101 of the chamber body 110. Additional details for the edge ring assembly 200, the pedestal 150 and the purge ring 280 are provided in a commonly-assigned U.S. patent application entitled "Wafer Pedestal With A Purge Ring", U.S. Pat. No. 6,159,299, filed simultaneously herewith. Some of the key features for these components are provided here to help in understanding the present invention.

Figure 2B:
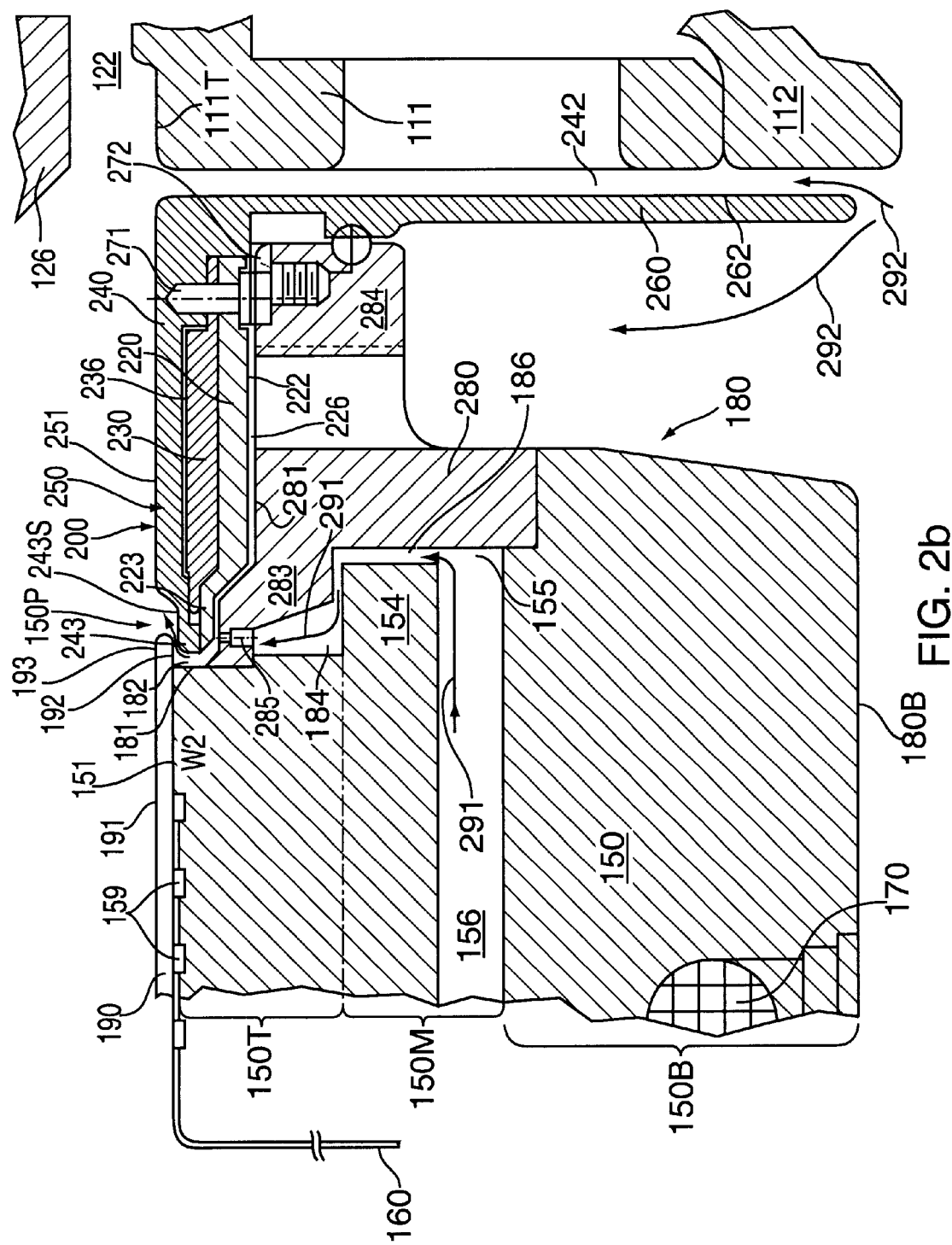

FIG. 2b is an expanded cross-sectional view of the pedestal 150, the purge ring 280 and the edge ring assembly 200. The support pedestal 150 is substantially circular in shape, and has a heater element 170 embedded inside which is used to maintain the pedestal 150 at a certain desired temperature. A wafer 190, which is placed upon the wafer support surface 151 of the pedestal 150, can then be maintained at a relatively constant temperature during wafer processing. The pedestal 150 has a step-like structure such that the top portion 150T of the pedestal 150 has a smaller circumference than the middle portion 150M, which in turn has a smaller circumference than the bottom portion 150B. A total of eight channels 156 are provided inside the pedestal 150 for introducing a purge gas to flow along a vertical edge 181 of the pedestal 150 near the top 150T. These channels 156 extends from the center of the pedestal 150 radially outwards to the openings 155, as shown in FIG. 2b. Other channels 159 are provided on the top surface 151 of the pedestal 150 for vacuuming chucking of the wafer 190. These channels 159 are connected to a vacuum line 160 located inside the shaft 164 of the pedestal 150.

The purge ring 280, which is made of aluminum, is designed for directing a purge gas flow around the vertical edge 181 of the pedestal 150. The purge ring 280 is welded onto the heated pedestal 150 to form an integral unit, also known as a purge heater 180. Hundreds of equally spaced small holes 285 are provided on the inside portion 283 of the purge ring 280 so as to direct a purge gas flow along the vertical edge 181 of the pedestal 150. A channel 186 is formed between the middle portion 150M of the pedestal 150 and the purge ring 280. This channel 186 connects the opening 155 to a space 184 defined between the top portion 150T of the pedestal 150 and the purge ring 280.

A three-piece edge ring assembly 200, is located generally around the outer perimeter 150P of the pedestal 150. As shown in FIG. 2b, the edge ring assembly 200 rests upon the purge ring 280, which fits around a step, or flange portion 154 of the pedestal 150. The edge ring assembly 200 comprises a top ring 240, a middle ring 230, and a lower ring 220. The top ring 240 is an annular aluminum piece with a substantially inverted L-shaped cross-section. The horizontal portion 250 of the top ring 240 rests on top of the upper surface 236 of a middle ring 230, while the vertical portion 260 of the top ring 240 extends downwards adjacent and in close proximity to the purge ring 280 and the pedestal 150. The middle ring 230 is a substantially flat annular piece which fits between the top ring 240 and the bottom ring 220. The bottom ring 220 is also substantially flat and annular in shape, with its inside portion 223 shaped to be complementary with the inside portion 283 of the purge ring 280. Both the middle ring 230 and the bottom ring 220 are made of 316 grade stainless steel. The top ring 240, middle ring 230 and bottom ring 220 are bolted together by three centering bolts 271, and the entire edge ring assembly 200 rests upon three sitting pins 272 which are screwed into the outer portion 284 of the purge ring 280. A narrow channel 226 is formed between the top 281 of the purge ring 280 and the bottom 222 of the lower ring 220 to provide a flow path for a purge gas.

The edge ring assembly 200 is made of stainless steel and aluminum. Exposed surfaces, such as the top surface 251 and the outside edge 262 of the top ring 240, are roughened by bead-blasting to improve adhesion of undesirable deposits that are formed on these surfaces. This improved adhesion minimizes the chance of deposits flaking off from the edge ring assembly 200, and thus helps in mitigating particulate contamination of the wafer 190.

During wafer processing, a purge gas, such as nitrogen or argon, is directed to flow along the top vertical edge 181 of the pedestal 150 towards the backside 192 of the wafer 190. Nitrogen ($N_2$) is selected as purge gas in this particular embodiment of the invention. Other gases, including inert gases, may also be used as long as they are process transparent. The purge gas is introduced into channels 156 inside the pedestal 150, and exits via openings 155 located around the outer perimeter at the middle portion 150M of the pedestal 150. It follows a channel 186 and enters a space 184 formed between the pedestal 150 and the purge ring 280. From the space 184, the gas then flows through numerous small holes 285 in the purge ring 280 into another space 182 adjacent to a vertical edge 181 of the pedestal 150. This space 182 is defined generally by the inside portion 283 of the purge ring 280, the inside portions 243, 223, of the top and bottom rings 240, 220, the vertical edge 181 of the pedestal 150 and the backside 192 of a wafer 190 resting on top of the pedestal 150. This edge purge flow pattern, illustrated by the arrow 291, helps prevent undesirable film deposition on the vertical edge 181 of the pedestal 150 and on the inside portion 243 of the top ring 240.

The incorporation of this high edge purge flow during deposition is a key feature of the present invention. Without an effective edge purge, undesirable deposits tend to accumulate around the backside 192 of the wafer 190, the vertical edge 181 of the pedestal 150, or over the surface 243S of the inside portion 243 of the top ring 240. During a post-deposition plasma anneal step, these deposits may give rise to a secondary plasma, or micro-arcing, resulting in damage to the wafer 190. Not only does the implementation of this high flow edge purge eliminate the micro-arcing problem, it also significantly reduces the equipment downtime during periodic maintenance by keeping the purge heater 180 maintenance-free.

A bottom purge flow, shown by the arrow 292, directs a second purge gas around the elongated, vertical portion 260 of the top ring 240. This bottom purge gas flow is introduced by a separate gas line (not shown) through the bottom of the chamber 100, and helps minimize undesirable deposition on the edge ring assembly 200 and the backside 180B of the purge heater 180. One part of the bottom purge gas flow is directed into the channel 226 formed between the bottom ring 220 and the purge ring 280, where it merges with the edge purge flow in space 182. A second part of the bottom purge gas flow around the outside surface 262 of the elongated portion 260 of the top ring 240 into a space 242 defined between the elongated portion 260 and the inner shield 111. The purge gas is then pumped out, along with process gases, reaction by-products and edge purge gases via the space 122 between the lid isolator 126 and the top 11T of the inner shield 111.

$N_2$ is used for both edge and bottom purge flows in the present invention, but argon or other gases, including inert gases, may also be used, as long as it does not interfere with the actual deposition process. In the preferred embodiment, a $N_2$ flow rate of about 1500 sccm is used for the edge purge, while that of the bottom purge is about 1000 sccm. In general, a flow range of about 500–3000 sccm is acceptable for both the edge and the bottom purge. Such relatively high flow rates are necessary to effectively prevent deposition in the proximity of the pedestal 150 and the edge ring assembly 200. Another advantage of this high purge flow is that it reduces the temperature of the edge ring assembly 200 to approximately (310°±10° C.). This reduced temperature serves to further minimize undesirable film deposition on the edge ring assembly 200. With this dual-purge (edge and bottom) capability, the process of the present invention results in a dramatic improvement in chamber performance, both by extending the time between cleans as well as preventing micro-arcing and particulate contamination.

The edge purge provision further contributes to another important feature of the present invention. Aside from minimizing undesirable deposits, the edge purge is found, somewhat surprisingly, to contribute to an improved TiN deposition rate as well as step coverage. This will be further discussed below in connection with the TiN deposition process.

TiN Deposition Process

In the present embodiment, TDMAT is used as the precursor species for the deposition of TiN film and helium is used as a carrier gas. Nitrogen and additional helium are further used as dilutant gases during deposition. Alternatively, metallo-organic compounds such as other alkyl members of tetrakis dialkylamino-titanium, may also be used as precursor species. Similarly, a variety of gases such as argon (Ar), hydrogen ($H_2$), nitrogen ($N_2$), among others, may be used as either the carrier gas, or dilutant gases, if desired. In the present invention, the deposition process parameters can range from a wafer temperature of about 150° C. to 380° C., a total pressure from about 2 torr to 50 torr, TDMAT/He flow rate of about 200–500 sccm, $N_2$ flow rate of about 500–2000 sccm, and a He dilutant flow in the range of 200–1000 sccm. The deposition is preferably performed at a wafer temperature of below 350° C., a total pressure of about 5 torr, a TDMAT/He flow rate of about 275 sccm, $N_2$ flow of about 1000 sccm, with an additional He dilutant flow at about 325 sccm. During this deposition process, a $N_2$ edge and bottom purge gas flow in the range of 500–3000 sccm is also established below the wafer pedestal 150 and the edge ring assembly 200. It should be recognized that the relatively low process temperature used in the present embodiment is meant for illustration only. Specifically, this low temperature process is directed towards compatibility with low κ dielectric materials. For other applications, higher wafer temperatures can also be used in conjunction with the process parameters disclosed in the present invention.

For thermal CVD process, a reduction in the process temperature tends to result in improved step coverage, albeit at a reduced film deposition rate. It is important, from a manufacture point of view, that a sufficiently high deposition rate be maintained to avoid compromising the overall process throughput.

It was discovered that the TiN deposition rate is also dependent on the purge gas flow, and in particular, on the edge purge flow. Not only does this edge purge minimize undesirable deposits on the circumferential edge 181 of the pedestal 150, it also results in an increase in deposition rate by about 10%. This may be explained by a secondary effect of the edge purge flow, which acts as a barrier to confine gases proximate to the wafer 190. These gases, which include process gases and possible reaction intermediates or products, are confined by the presence of the edge purge gas to the frontside 191 of the wafer 190.

As practiced in the present invention, an increase in both the total pressure and $N_2$ edge purge gas flow rate results in a process of conformal TiN deposition at a rate of more than 6 Å/sec. even when using a low temperature (e.g., 350° C.). Furthermore, a step coverage of approximately 90% is achieved for an aspect ratio of about 4:1, compared with a step coverage of only about 80% for prior art processes performed at 1.5 torr.

In addition, excellent uniformity results for both film thickness and sheet resistance are obtained from the current process. For example, a sheet resistance uniformity of better than 8% is achieved, compared to 12% for the previous process at 1.5 torr. Note that the uniformity cited here refers to that obtained for a "1×50" process—i.e., 50 Å of TiN film is deposited in a single cycle of deposition and anneal (as opposed to a multi-cycle "n×50" deposition and anneal, where a number of n cycles are performed for 50 Å each, which would yield an improved uniformity.) Both the thickness uniformity and the sheet resistance uniformity are also improved by the edge purge. For example, the addition of the edge purge leads to an increased TiN film thickness close to the edge 193 of the wafer 190, resulting in an improved thickness uniformity. By contrast, increasing the bottom purge flow rate seems to have a negligible effect on deposition rate or uniformity. A forty-nine point within-wafer measurement gives a thickness uniformity of less than about 4% (standard deviation) for the process of the present invention.

Experiments also show that, contrary to what one may ordinarily expect, the high $N_2$ dilutant flow is not the source for the nitrogen in the as-deposited TiN film. Instead, the nitrogen in the as-deposited TiN film originates from the TDMAT precursor itself. In other words, the $N_2$ dilutant in the present invention does not behave as a "reactive" carrier or otherwise act as an "active" species, as disclosed in the prior art.

Backside Pressure and Vacuum Chucking

As illustrated in FIG. 1, the backside 192 of the wafer 190 is connected to a vacuum pump 14 via a vacuum line 160. However, in addition to this reduced pressure created at the backside 192 by the pump 14, a steady flow of a "backside gas" is maintained such that there is a pressure of about 3.5 torr exerted on the backside 192 of the wafer 190 during film deposition. This is accomplished by connecting the vacuum line 160 to numerous grooves 159 provided at the top surface 151 of the pedestal 150, as illustrated in FIG. 2b. Although nitrogen is used as the backside gas in this particular embodiment, other gases such as argon or helium may also be used, among others. The actual nitrogen flow rate depends on the pumping speed of the vacuum pump 14 used for vacuum chucking. For example, in the present process, a nitrogen flow rate in the range of about 20–90 sccm is sufficient to maintain the backside pressure within a range of about 2–4.5 torr. This backside pressure, together with the total frontside pressure from the process gases, create a pressure difference of about 1.5 torr between the front surface 191 and the backside 192 of the wafer 190. The net pressure on the front surface 191 of the wafer 190 secures the wafer 190 onto the heated pedestal 150. In general, the larger the net pressure on the front surface 191, the stronger is the chucking force on the wafer 190. Typically, a pressure difference equal to about 20% of the front side pressure is sufficient to secure the wafer 190. For the operating pressure range used in this invention, a pressure difference of at least about 1 torr is desirable.

The backside gas pressure contributes to yet another key feature of the present invention. In a typical thermal CVD process, the wafer temperature is a critical process parameter—this is especially true in the current pressure-temperature regime, where the film deposition rate is limited by surface reaction. Since the wafer 190 is directly heated by the pedestal 150 in this embodiment, good thermal contact between the wafer 190 and the pedestal 150 is essential to ensure a reliable temperature control of the process. The use of a backside gas in the present invention results in a considerable improvement in the thermal conduction between the wafer 190 and the heated pedestal 150. The temperature difference between the wafer 190 and the pedestal 150 is a good indicator of the effectiveness of the thermal conduction between the wafer 190 and the pedestal 150—the smaller the difference, the better the thermal conduction. The wafer temperature is typically measured using a test wafer (not shown) with an embedded thermocouple. With the current inventive process, a temperature difference of less than about 40 degrees, or more specifically, 20–30 degrees, is observed between the wafer 190 and the pedestal 150 (the implicit assumption is that the temperature of a wafer during processing is not substantially different from that measured for the test wafer.) This contrasts with the previous low pressure process without a backside gas, in which a temperature difference of about 80 degrees is observed. That is, in the present invention, to maintain a wafer temperature of about 350° C. during processing, a heater temperature of only 380° C. is needed; as opposed to about 430° C. for the previous low pressure process. Not only does this reduced temperature operation extend the life of the heater 180, but the thermal budget and process margin for the overall film deposition process are also improved. This will be elaborated below in connection with a subsequent plasma treatment step. The efficient thermal conduction between the pedestal 150 and the wafer 190 leads to a reliable control of the wafer processing temperature, and contributes to excellent wafer-to-wafer process uniformity. Thus, the increased process gas pressure along with the use of a high flow purge and a backside gas, allow TiN deposition to be performed at a reasonably high deposition rate with good uniformity. The resulting process at a reduced wafer temperature is also compatible with the use of low κ dielectric materials.

$N_2/H_2$ Plasma Treatment

The as-deposited TiN film properties are typically far from perfect for its intended use as a diffusion barrier. For example, the film may contain a high level of carbon, about 20–25%, and tends to have a high resistivity. Upon exposure to air or moisture, the resistivity is further increased due to oxygen absorption in the film. To be effective as a barrier layer, a film resistivity below about 1000 $\mu\Omega$-cm is typically required. Therefore, the as-deposited film is subject to a plasma treatment step which leads to a resulting film with decreased resistivity, increased purity, density and improved stability.

The plasma treatment step can be performed at a total $H_2$ and $N_2$ flow rate of about 200–1500 sccm, with $N_2$ flow rate of 200–900 sccm, $H_2$ flow rate of 300–900 sccm and a pressure in the range of 1–3 torr. However, a total $H_2$ and $N_2$ flow rate of 500–1000 sccm and a total pressure of approximately 1.3 torr are preferred. Although a $H_2$ to $N_2$ flow ratio of 1.5 is used in the current process, a ratio ranging from 1 to 2 is also acceptable. This flow ratio, however, is not critical to the practice of the present invention. It is found that increasing the total flow rate, while keeping the same total pressure and flow ratio, tends to improve the efficiency of the plasma treatment process. A RF frequency in the range of 70 kHz–13.6 MHz and a power in the range of 500–1000 W can be used for plasma treatment, but a low frequency 350 kHz RF signal at about 750 W is preferred. The RF power is applied to the showerhead 120 via a RF supply (not shown), with the chamber walls and pedestal forming the RF ground. Nitrogen-containing and hydrogen-containing species (including ions and neutrals, atoms and molecules) generated in the plasma modify the microstructure and/or chemical composition of the deposited TiN film. Although the exact mechanism of this plasma process is not fully understood, the plasma treated TiN film is found to have reduced the carbon content to less than 5%, reduced film resistivity to about 250 $\mu\Omega$-cm and improved resistance to oxygen incorporation upon exposure to air or moisture. The TiN film is also densified by the plasma treatment, with a pre-treatment thickness of 100 Å being reduced to about 50 Å after treatment. Depending on the specific application, other gases such as argon, helium and ammonia may also be used during this plasma treatment step. For example, the use of heavier species in the plasma gases may result in different film characteristics compared with lighter species. In other applications, incorporation of certain species from the plasma gases into the treated film may also be desirable. Details of this plasma treatment process have been disclosed in a commonly-assigned U.S. application entitled "Construction of a Film on a Semiconductor Wafer", Ser. No. 08/810,221, filed Feb. 28, 1997, and is herein incorporated by reference.

As previously mentioned, the current process improves the wafer-pedestal thermal conduction, and allows a lower wafer temperature to be used during film deposition. This is significant because during the plasma treatment step, no backside gas pressure is used. Instead, the three-way valve 162 is positioned to shut off the gas supply 15 to the wafer backside 192, such that the backside pressure corresponds to the base pressure established by the vacuum pump 14. There is no active wafer temperature control beyond that provided by the wafer-pedestal thermal contact. Therefore, the wafer temperature tends to increase during plasma annealing as a result of bombardment by energetic species. In the present invention, the wafer temperature increases by only about 20° C. during the plasma treatment step. In general, the maximum wafer temperature increase is expected to be equal to the temperature difference between the wafer 190 and the heated pedestal 150. Therefore, the reduced wafer-pedestal temperature difference in the present invention provides a certain temperature stability to the wafer 190 by avoiding an otherwise large temperature excursion during different steps of the wafer processing sequence. This results in an improvement of the thermal budget and provides an extra process margin for the overall process.

TiN Deposition Process Recipe

The present inventive process may be implemented in different process chambers that are adapted for chemical vapor deposition with temperature control of the substrate. One such chamber is the Model HPTxZ chamber manufactured by Applied Materials Inc. of Santa Clara, Calif.

FIG. 3 depicts a table representing the process steps used to form a TiN film in accordance with the present invention. After a wafer 190 has been loaded onto the pedestal 150, the process sequence starts with a pumpdown step (1) in which the process chamber 100 is evacuated to a starting base pressure with the purge heater 180 already set to a temperature of about 380° C. In Step (2), the wafer 190 is "chucked", or retained onto the pedestal 150 by vacuum chucking. During this step, the proper pressure and gas flows are established by flowing dilutant gases such as He at 600 sccm and $N_2$ at 1000 sccm through the showerhead 120.

A wafer heatup step (3) takes place for about the next sec. during which the $N_2$ purge gas flows are also established at rates of about 1500 sccm for the edge purge and 1000 sccm for the bottom purge, along with a backside gas pressure of about 4.5 torr. He dilutant gas flow is then reduced to about 325 sccm and a flow of He carrier gas of 275 sccm (bypassing the TDMAT bubbler) is established during the pre-deposition step (4). The backside gas pressure is also reduced to about 3.5 torr and a chamber pressure to about 5 torr. Step (5) is the TiN deposition step, in which TDMAT is introduced into the chamber 100 by flowing the He carrier gas through the bubbler. This deposition step (5) lasts for about 18 sec., during which the chamber pressure is servo-controlled at about 5 torr, and all the process and purge gas flows are maintained at their respective flow rates.

After film deposition, $N_2$ and $H_2$ gas flows are established within the chamber in step (6) in preparation for the in-situ plasma treatment of the deposited TiN film.

During the plasma treatment step (7), the chamber pressure is maintained at about 1.3 torr, and the $N_2$ and $H_2$ gas flows are maintained at about 300 sccm and 450 sccm respectively. The plasma treatment step (7) is initiated at a RF power of about 750 W, and lasts for about 35 sec. Unlike the film deposition step, neither purge gas flows or backside gas is used during the plasma treatment step (7). At the end of the film treatment, the chamber is purged with a $N_2$ flow of about 1000 sccm in step (8) prior to unloading the wafer 190 from the process chamber 100.

CONCLUSION

The present invention is a MOCVD process for TiN film deposition using thermal decomposition of TDMAT at a temperature below about 350° C. This invention comprises a two-step process of TiN film deposition followed by a plasma treatment in the presence of $N_2$ and $H_2$. At a total pressure of approximately 5 torr and a total $N_2$ and He flow rate of about 1600 sccm, conformal TiN film deposition at more than 6 Å/sec. is achieved at a temperature below 350° C. Furthermore, a high edge purge gas flow and a wafer backside pressure of about 3.5 torr contribute to significant improvements in uniformity (both thickness and resistivity) and step coverage. The present invention leads to a process with a thickness uniformity of below 4% (standard deviation) and a step coverage of better than 90%. The use of a backside gas significantly improves thermal conduction between the wafer and the pedestal, and results in a process which is compatible with the temperature requirement of low dielectric materials used for 0.25 µm device applications. The dual-purge capability of this invention mitigates the problems of micro-arcing and particulate contamination by keeping the pedestal maintenance-free, and greatly facilitates periodic maintenance by reducing the equipment downtime.

Although a preferred embodiment which incorporates the teachings of the present invention has been shown and described in detail, those skilled in the art can readily devise many other varied embodiments that still incorporate these teachings.

What is claimed is:

1. A method of processing a substrate comprising the step of:

supplying to a chamber containing said substrate a metallo-organic compound, a dilutant gas, and a purge gas having a flow rate of at least about 500 sccm to produce a pressure within the chamber of at least about 2 torr; and heating said substrate to cause thermal decomposition of said metallo-organic compound to form a film upon said substrate.

2. The method of claim 1, wherein said metallo-organic compound contains titanium.

3. The method of claim 2, wherein said metallo-organic compound is tetrakis(dialkylamino)-titanium.

4. The method of claim 1, wherein said film is titanium nitride.

5. The method of claim 1, wherein said dilutant gas is selected from the group of nitrogen, helium and argon.

6. The method of claim 1, wherein said dilutant gas is supplied to the chamber at a flow rate of at least 500 sccm.

7. The method of claim 1, wherein said substrate is supported in said chamber by a pedestal and said purge gas is directed towards an edge of said pedestal.

8. The method of claim 7, wherein said pedestal has a temperature of not more than approximately 40° C. above said temperature of said substrate.

9. The method of claim 7, further comprising the step of:

directing a gas flow from a channel within said pedestal to establish a gas pressure upon said back surface of said substrate which is lower than a pressure upon a front surface of said substrate.

10. The method of claim 9 further comprising the step of:

plasma treating said film in an environment containing a gas or gases selected from the group of nitrogen, hydrogen, helium, argon and ammonia.

11. The method of claim 10, wherein said plasma treating step is performed at a total pressure of less than about 2 torr.

12. The method of claim 1, further comprising the steps of:

directing a first purge gas flow towards an edge of said substrate; and directing a second purge gas flow towards a bottom of an edge ring assembly that circumscribes said substrate.

13. The method of claim 12, wherein said first purge gas flow is at least about 1500 sccm.

14. The method of claim 12, wherein said first and second purge gases are chosen from the group of nitrogen, helium, argon, or hydrogen.

15. The method of claim 1, wherein thermal decomposition of said metallo-organic compound occurs at a temperature of less than about 350° C.

16. The method of claim 1, further comprising the step of maintaining a second gas pressure of approximately between 2 to 5 torr upon a back surface of said substrate.

17. The method of claim 1, further comprising the step of maintaining a first gas pressure upon a front surface of said substrate and maintaining a second gas pressure upon a back surface of said substrate; wherein said second gas pressure is less than said first gas pressure by at least about 20% of said first gas pressure.

18. The method of claim 1, further comprising the step of maintaining a first gas pressure upon a front surface of said substrate and maintaining a second gas pressure upon a back surface of said substrate; wherein said second gas pressure is less than said first gas pressure by at least 1 torr.

19. The method of claim 17, wherein said second gas pressure upon said back surface of said substrate is provided by a gas selected from a group of nitrogen, argon, hydrogen, or helium.

20. A method of processing a substrate comprising the steps of:

(a) supporting said substrate upon a pedestal;

(b) maintaining said substrate at a process temperature by a heating element embedded within said pedestal;

(c) supplying to said chamber a metallo-organic compound containing titanium, a dilutant gas flow of at least about 500 sccm and a purge gas flow of at least about 500 sccm to produce a pressure of at least about 5 torr;

(d) thermally decomposing said metallo-organic compound; and (e) forming a film comprising titanium nitride upon said substrate.

21. A method of processing a substrate comprising the step of:

supplying to a chamber containing said substrate a metallo-organic compound, a dilutant gas, and a purge gas;

directing a first purge gas flow towards an edge of said substrate;

directing a second purge gas flow towards a bottom of an edge ring assembly that circumscribes said substrate;

heating said substrate to cause thermal decomposition of said metallo-organic compound to form a film upon said substrate.

22. The method of claim 21, wherein said first purge gas flow is at least about 1500 sccm.

23. The method of claim 21, wherein said first and second purge gases are chosen from the group of nitrogen, helium, argon, or hydrogen.

* * * * *

UNITED STATES PATENT AND TRADEMARK OFFICE
CERTIFICATE OF CORRECTION

PATENT NO.   : 6,365,495 B2
DATED        : April 2, 2002
INVENTOR(S)  : Wang et al.

It is certified that error appears in the above-identified patent and that said Letters Patent is hereby corrected as shown below:

<u>Title page,</u>
Item [56], References Cited, U.S. PATENT DOCUMENTS, please replace "6/2000" with -- 10/1996 --.

<u>Column 3,</u>
Line 49, please replace "ts" with -- is --.

<u>Column 5,</u>
Line 5, please replace "aereresulting" with -- resulting --

<u>Column 7,</u>
Line 27, please replace "11T" with -- 111T --.

<u>Column 11,</u>
Line 35, please replace "next sec." with -- next 20 sec. --

Signed and Sealed this

Seventeenth Day of December, 2002

JAMES E. ROGAN
*Director of the United States Patent and Trademark Office*